(12) United States Patent
Ashjaee et al.

(10) Patent No.: US 8,975,967 B2
(45) Date of Patent: Mar. 10, 2015

(54) ANTENNA LNA FILTER FOR GNSS DEVICES

(71) Applicant: JAVAD GNSS, Inc., San Jose, CA (US)

(72) Inventors: Javad Ashjaee, Saratoga, CA (US); Dmitry Dubrovsky, Moscow (RU)

(73) Assignee: Javad GNSS, Inc., San Jose, CA (US)

( * ) Notice: Subject to any disclaimer, the term of this patent is extended or adjusted under 35 U.S.C. 154(b) by 143 days.

(21) Appl. No.: 13/672,329

(22) Filed: Nov. 8, 2012

(65) Prior Publication Data

US 2013/0113571 A1     May 9, 2013

Related U.S. Application Data

(60) Provisional application No. 61/557,847, filed on Nov. 9, 2011.

(51) Int. Cl.
    *H03F 3/04*      (2006.01)

(52) U.S. Cl.
    USPC ............................ 330/302; 330/306; 330/310

(58) Field of Classification Search
    USPC ........................................ 330/302, 306, 310
    IPC ......................................................... H03F 3/04
    See application file for complete search history.

(56) References Cited

U.S. PATENT DOCUMENTS

| | | | |
|---|---|---|---|
| 5,119,509 A | | 6/1992 | Kang |
| 5,596,600 A | | 1/1997 | Dimos et al. |
| 6,784,831 B1 * | | 8/2004 | Wang et al. ............... 342/357.63 |
| 6,975,847 B1 * | | 12/2005 | Bienek et al. .................. 455/306 |
| 7,092,676 B2 * | | 8/2006 | Abdelgany et al. ............. 455/76 |
| 8,022,868 B2 | | 9/2011 | Yudanov et al. |
| 8,130,872 B2 * | | 3/2012 | Brunn et al. ................... 375/316 |
| 8,145,172 B2 * | | 3/2012 | Khoini-Poorfard et al. .. 455/266 |
| 8,217,833 B2 * | | 7/2012 | Webber et al. ........... 342/357.75 |
| 8,587,477 B2 * | | 11/2013 | Samavati et al. ......... 342/357.76 |
| 2005/0242994 A1 | | 11/2005 | Cobb et al. |
| 2005/0259760 A1 | | 11/2005 | Casabona et al. |
| 2008/0208454 A1 | | 8/2008 | Pesterev et al. |
| 2008/0214137 A1 | | 9/2008 | Qian |
| 2009/0189804 A1 | | 7/2009 | Ashjaee et al. |
| 2012/0243447 A1 * | | 9/2012 | Weissman et al. ............. 370/280 |
| 2013/0021934 A1 * | | 1/2013 | Rugamer et al. .............. 370/252 |

FOREIGN PATENT DOCUMENTS

| | | |
|---|---|---|
| GB | 2390241 A | 12/2003 |
| WO | 2007/044652 A2 | 4/2007 |
| WO | 2007/044652 A3 | 11/2007 |
| WO | 2007/148261 A2 | 12/2007 |
| WO | 2007/148261 A3 | 6/2008 |
| WO | 2008/103757 A1 | 8/2008 |

OTHER PUBLICATIONS

International Search Report and Written Opinion received for PCT Application No. PCT/US2012/063981, mailed on Feb. 27, 2013, 12 pages.
Barnes et al., "An Overview of Microwave Component Requirements for Future Space Applications", 2005, 8 pages.
Miyashita, Kiyoshi, "A Plastic Packaged Ku-Band LNB with Very High Susceptibility to Supply PLL in 0.18um CMOS", SiRF, 2010, pp. 188-191.
International Search Report and Written Opinion recevied for PCT Patent Application No. PCT/US2013/060434, mailed on Jan. 9, 2014, 9 pages.

* cited by examiner

*Primary Examiner* — Patricia Nguyen
(74) *Attorney, Agent, or Firm* — Morrison & Foerster LLP

(57) ABSTRACT

A low-noise amplifier (LNA) filter for use with global navigation satellite system (GNSS) devices is disclosed. A first LNA stage, which is configured to connect to an antenna configured to receive GNSS signals, includes an LNA. A second LNA stage, which is connected to the output of the first LNA stage, has a surface acoustic wave (SAW) filter and an LNA. A third LNA stage, which is connected to the output of the second LNA stage, also has a SAW filter and an LNA.

21 Claims, 8 Drawing Sheets

| Item | Specification | | |
|---|---|---|---|
| | -30 to +85°C | 25±2°C | typ. |
| Nominal Center Frequency(fc) | 1575.42/1602MHz | | |
| Insertion Loss | | | |
| (1565.42 to 1585.42 MHz) | 1.8 dB max. | 1.6 dB max. | 1.4 dB |
| (1574.42 to 1576.42 MHz) | 1.3 dB max. | 1.2 dB max. | 1.0 dB |
| (1597.55 to 1605.89 MHz) | 2.2 dB max. | 1.8 dB max. | 1.5 dB |
| Absolute Attenuation | | | |
| 1) 10 to 960 MHz | 48 dB min. | 45 dB min. | 53 dB |
| 2) 1427 to 1463 MHz | 38 dB min. | 36 dB min. | 46 dB |
| 3) 1710 to 1785 MHz | 35 dB min. | 35 dB min. | 38 dB |
| 4) 1850 to 1910 MHz | 40 dB min. | 40 dB min. | 45 dB |
| 5) 1920 to 1980 MHz | 40 dB min. | 40 dB min. | 48 dB |
| 6) 2400 to 2500 MHz | 45 dB min. | 45 dB min. | 56 dB |
| Absolute Attenuation (common mode) | | | |
| 1) 777 to 915 MHz | 35 dB min. | 35 dB min. | 40 dB |
| 2) 1427 to 1463 MHz | 36 dB min. | 36 dB min. | 43 dB |
| 3) 1710 to 1785 MHz | 33 dB min. | 33 dB min. | 38 dB |
| 4) 1850 to 1910 MHz | 35 dB min. | 35 dB min. | 40 dB |
| 5) 1920 to 1980 MHz | 35 dB min. | 35 dB min. | 40 dB |
| 6) 2400 to 2500 MHz | 30 dB min. | 30 dB min. | 37 dB |
| GDT Ripple Deviation (1597.55 to 1605.89 MHz) | 6.5 ns max. | 6.0 ns max. | 4.0 ns |
| Ripple Deviation | | | |
| (1565.42 to 1585.42 MHz) | 1.3 dB max. | 1.0 dB max. | 0.5 dB |
| (1597.55 to 1605.89 MHz) | 1.3 dB max. | 1.0 dB max. | 0.5 dB |
| VSWR (1565.42 to 1605.89 MHz) | 2.2 max. | 2.1 max. | 1.8 |
| Amplitude Balance (1565.42 to 1605.89 MHz) | ±1.5 dB max. | ±1.2 dB max. | +0.7 dB |
| Phase Balance (1565.42 to 1605.89 MHz) | 180±10 deg. | 180±10 deg. | 180+3 deg. |
| Unbalance Port Matching Impedance (nominal) | 50Ω | | |
| Balance Port Matching Impedance (nominal) | 100Ω | | |
| Input Signal Level | 20mW(+13dBm), 2000hours | | |

Fig. 3

ANTENNA LNA FILTER FOR GNSS DEVICES

CROSS REFERENCE TO RELATED APPLICATIONS

This application claims the benefit under 35 USC 119(e) of U.S. Provisional Patent Application No. 61/557,847, filed Nov. 9, 2011, the disclosure of which is hereby incorporated by reference in its entirety.

BACKGROUND

1. Field

The present disclosure relates generally to low-noise amplifier (LNA) filters and, more specifically, to an antenna LNA filters for global navigation satellite system (GNSS) devices.

2. Description of Related Art

Navigation receivers that use GNSS, such as GPS or GLONASS (hereinafter collectively referred to as "GNSS"), enable a highly accurate determination of the position of the receiver. The satellite signals may comprise carrier harmonic signals that are modulated by pseudo-random binary codes and which, on the receive side, may be used to measure the delay relative to a local reference clock. These delay measurements are used to determine the pseudo-ranges between the receiver and the satellites. The pseudo-ranges are not true geometric ranges because the receiver's local clock is different from the satellite onboard clocks. If the number of satellites in sight is greater than or equal to four, then the measured pseudo-ranges can be processed to determine the user's single point location as represented by a vector, as well as to compensate for the receiver clock offset.

A more detailed description of determining a position based on signals from GNSS satellites and base stations is available in U.S. patent application Ser. No. 12/070,333, filed Feb. 15, 2008, published as US Patent Publication No. 2008/0208454 and U.S. Ser. No. 12/360,808, filed Jan. 27, 2009, published as US Patent Publication No. 2009/0189804 assigned to the assignee of the present application, and each of which are incorporated herein by reference in their entirety for all purposes.

Positioning accuracy of GNSS technology is directly dependent on the accuracy of the delay measurements. Transmissions from non-GNSS frequencies that are near GNSS frequencies can cause degraded performance of GNSS services, such as less positional accuracy, by interfering with the delay measurements.

For example, a GPS based GNSS device may use timing information transmitted on the L1 band from 1563.42 MHz to 1587.42 MHz. Without filtering, transmissions from the next lower band from 1525 MHz to 1559 MHz could interfere with accurate measurement of the timing signals in the L1 band. Many GPS-based devices employ antenna LNA filters to remove the unwanted frequencies in bands outside of the L1 band.

However, many of these GPS-based devices were designed with filters built based on assumptions about the signal strength of the transmissions in the 1525 MHz to 1559 MHz band. Specifically, as this portion of the spectrum was originally designated for satellite transmission, filters for some GPS-based devices assumed a weak signal strength for transmission in this spectrum. This assumption may not longer be accurate.

LightSquared is a wireless broadband company that is proposing to use the above frequency spectrum, which is just below the L1 band, to provide a nationwide high-speed wireless network. As discussed above, this spectrum was previously assigned for satellite based communication. Accordingly, many GPS-based devices were designed to only filter out inferences from this neighboring spectrum based on relatively weak signals that are transmitted from space.

However, part of LightSquared's network may involve ground based transmissions that are many orders of magnitude stronger than those that originate in space. Accordingly, filters designs based on an assumption about the power levels of signals in this neighboring spectrum may not be able to sufficiently filter out interference from LightSquared's network.

BRIEF SUMMARY

An embodiment of an LNA filter for use with a GNSS has a first LNA stage, which is configured to connect to an antenna configured to receive GNSS signals and includes an LNA. A second LNA stage, which is connected to the output of the first LNA stage, has a surface acoustic wave (SAW) filter and an LNA. A third LNA stage, which is connected to the output of the second LNA stage, also has a SAW filter and an LNA.

DESCRIPTION OF THE FIGURES

FIG. 3 depicts a table listing several parameters and specifications for a SAW filter that may be used to implement embodiments of the present disclosure.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Figure 1:
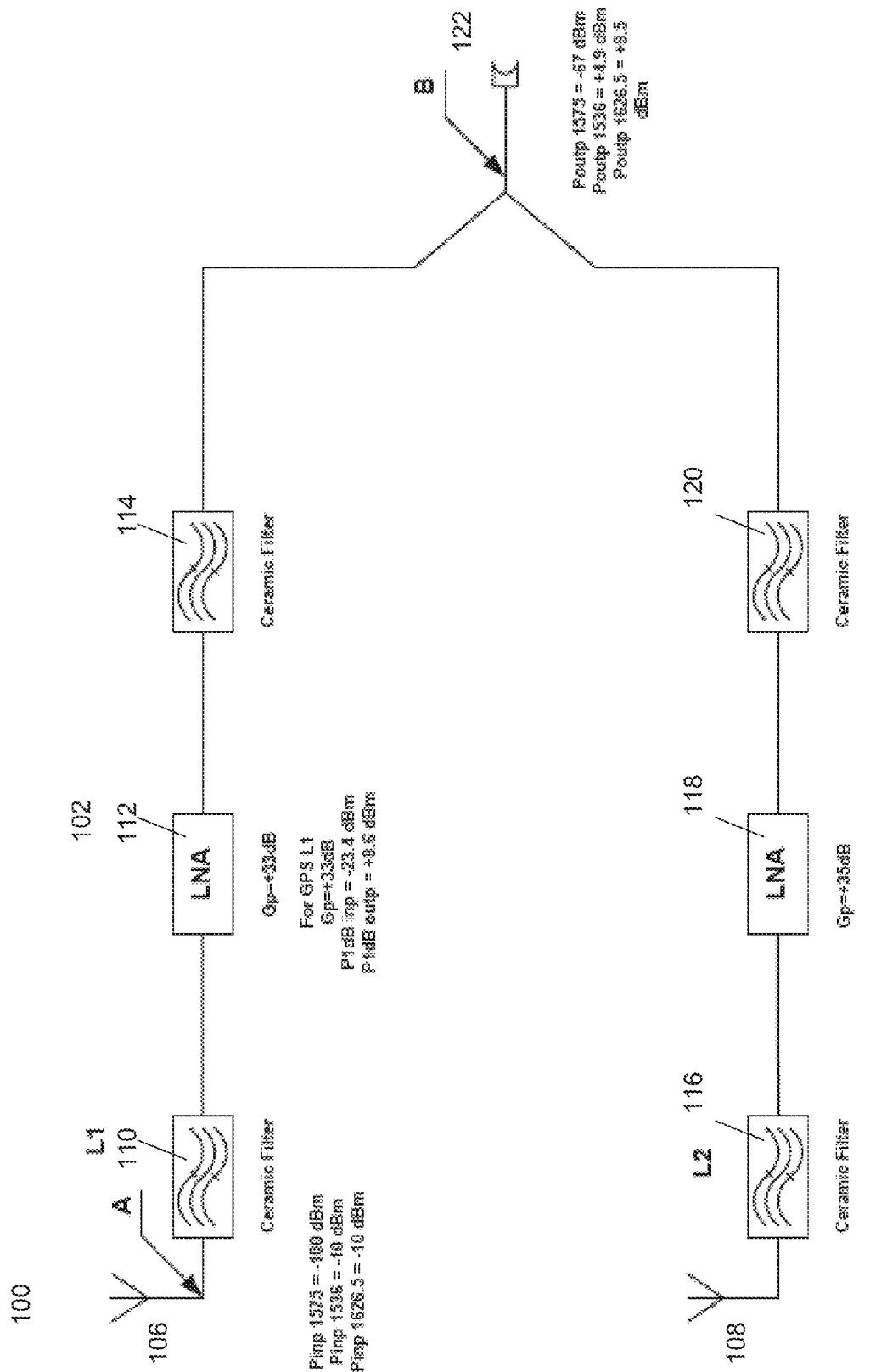
FIG. 1 depicts a first antenna LNA filter for use with a GNSS device.

FIG. 1 depicts a first LNA antenna filter having two signal paths: signal path 102 and signal path 104. Signal path 102 is electrically coupled to antenna 106, and signal path 104 is electrically coupled to antenna 108. While FIG. 1 depicts antenna 106 and antenna 108 as being distinct and separate antennas, these two antennas could also be the same antenna (e.g., signal path 102 and signal path 104 may be coupled to the same antenna).

Signal path 102 may be configured to receive GNSS signals on the L1 band (1563.42 MHz to 1587.42 MHz) whereas signal path 104 may be configured to receive GNSS signals on the L2 band (1215.6 to 1239.6 MHz). Signal path 102 and signal path 104 may couple together at junction 122, which may then couple to circuitry to convert the signals in each path to an intermediate frequency that is easier to handle when extracting information from the GNSS signals.

Signal path 102 may be implemented with filters 110 and 114 and LNA 112. Filters 110 and 114 reduce interference from frequencies outside of the L1 band. Filters 110 and 114 maybe implemented with, for example, ceramic filters. LNA 112 amplifies the GNSS signals received by antenna 106. LNA 112 may be selected to amplify the received GNSS signals while limiting the amount of noise introduced into the signals.

Similarly, signal path 104 may be implemented with filters 116 and 120 and LNA 118. Filters 116 and 120 reduce interference from frequencies outside of the L1 band. Filters 116 and 120 may be implemented with, for example, ceramic filters. LNA 118 amplifies the GNSS signals received by antenna 108. LNA 118 may be selected to amplify the received GNSS signals while limiting the amount of noise introduced into the signals.

Antenna LNA filter 100 may work well when filters 110, 114, 116, and 120 can sufficiently attenuate frequencies outside of the L1 and L2 bands so that those external frequencies do not affect the timing data transmitted in the L1 and L2 bands. However, if transmissions in portions of the spectrum neighboring the L1 or L2 bands increase in intensity beyond what filters 110, 114, 116, and 120 were designed to attenuate, then antenna filter 100 may be insufficient to prevent those transmissions from inferring with or degrading the GNSS signals.

Figure 2:
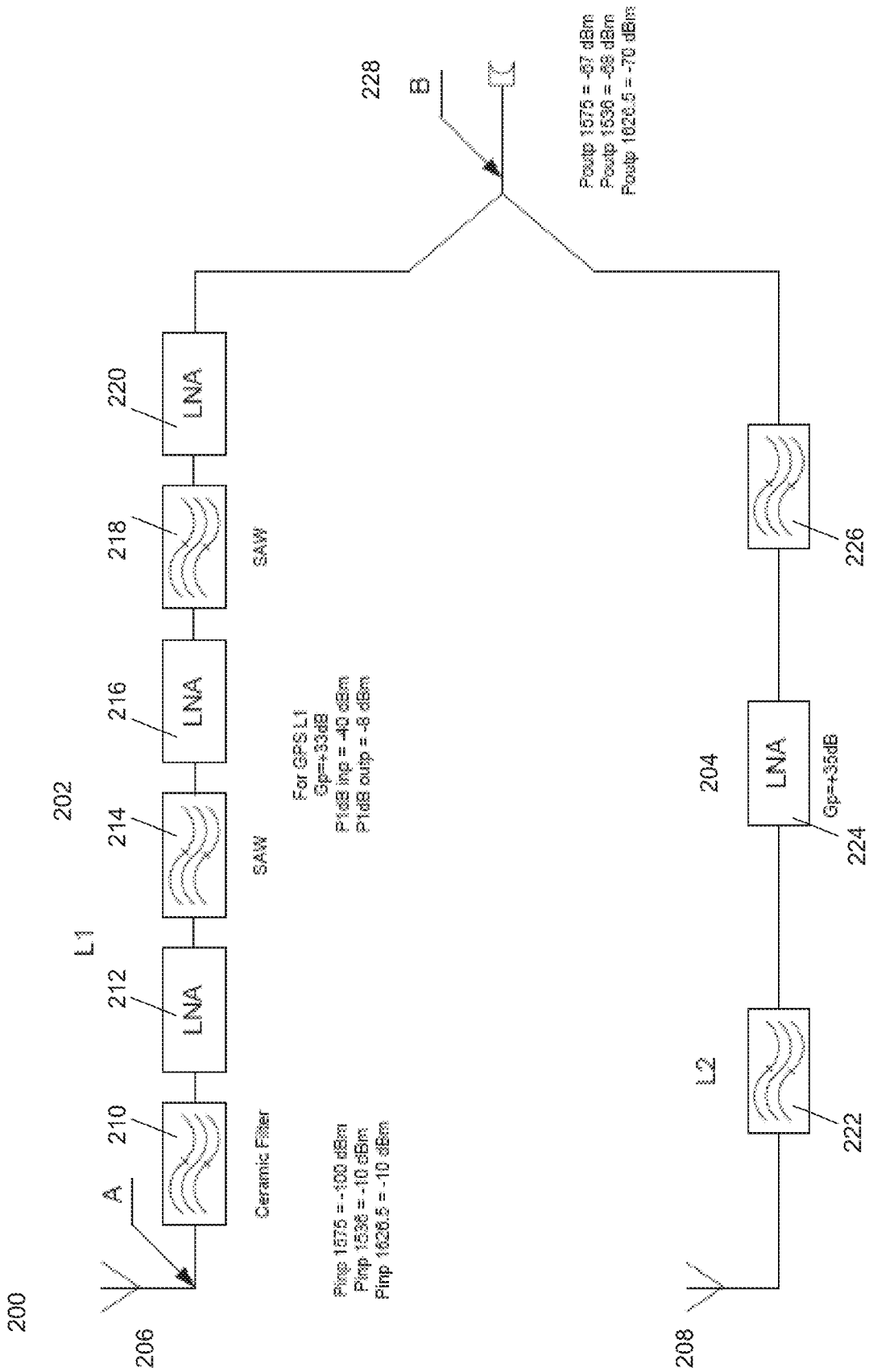
FIG. 2 depicts a second antenna LNA filter for use with a GNSS device according to one embodiment of the present disclosure.

FIG. 2 depicts an embodiment of a second antenna LNA filter 200 according to an embodiment of the present disclosure. Antenna LNA filter 200 has two signal paths: signal path 202 and signal path 204. Signal path 202 is electrically coupled to antenna 206, and signal path 204 is electrically connected to antenna 208. While FIG. 2 depicts antenna 206 and antenna 208 as being distinct and separate antennas, these two antennas could also be the same antenna (e.g., signal path 202 and signal path 204 may be coupled to the same antenna).

Signal path 202 may be configured to receive GNSS signals on the L1 band (1563.42 MHz to 1587.42 MHz) whereas signal path 204 may be configured to receive GNSS signals on the L2 band (1215.6 to 1239.6 MHz). Signal path 202 and signal path 204 may couple together at junction 228, which may then couple to circuitry to convert the signals in each path to an intermediate frequency that is more manageable for the processing necessary to extract data from the GNSS signals and determine a position based on those signals.

Signal path 204 may be implemented with filters 222 and 226 and LNA 224. Filters 222 and 226 reduce interference from frequencies outside of the L2 band. Filters 222 and 226 maybe implemented with, for example, ceramic filters. LNA 224 amplifies the GNSS signals received by antenna 208. LNA 224 may be selected to amplify the received GNSS signals while limiting the amount of noise introduced into the signals. For example, LNA 224 may be a pseudomorphic high electron mobility transistor (PHEMT).

For ease of discussion, signal path 202 will be explained with respect to three cascaded stages. However, division of signal path 202 in this manner should not be construed as limiting on the structure of the claims.

The first LNA stage of signal path 202 includes a filter and an LNA, specifically filter 210 and LNA 212. As the first LNA in the signal path, first LNA 212 may be selected to amplify the received GNSS signals while limiting the amount of noise introduced into the signals. In some cases, LNA 212 may have a lower noise figure than other LNAs in the 202 signal path. Additionally, LNA 212 may be selected to have a higher dynamic range than other LNAs in signal path 202. For example, LNA 212 may be a PHEMT.

Figure 4:
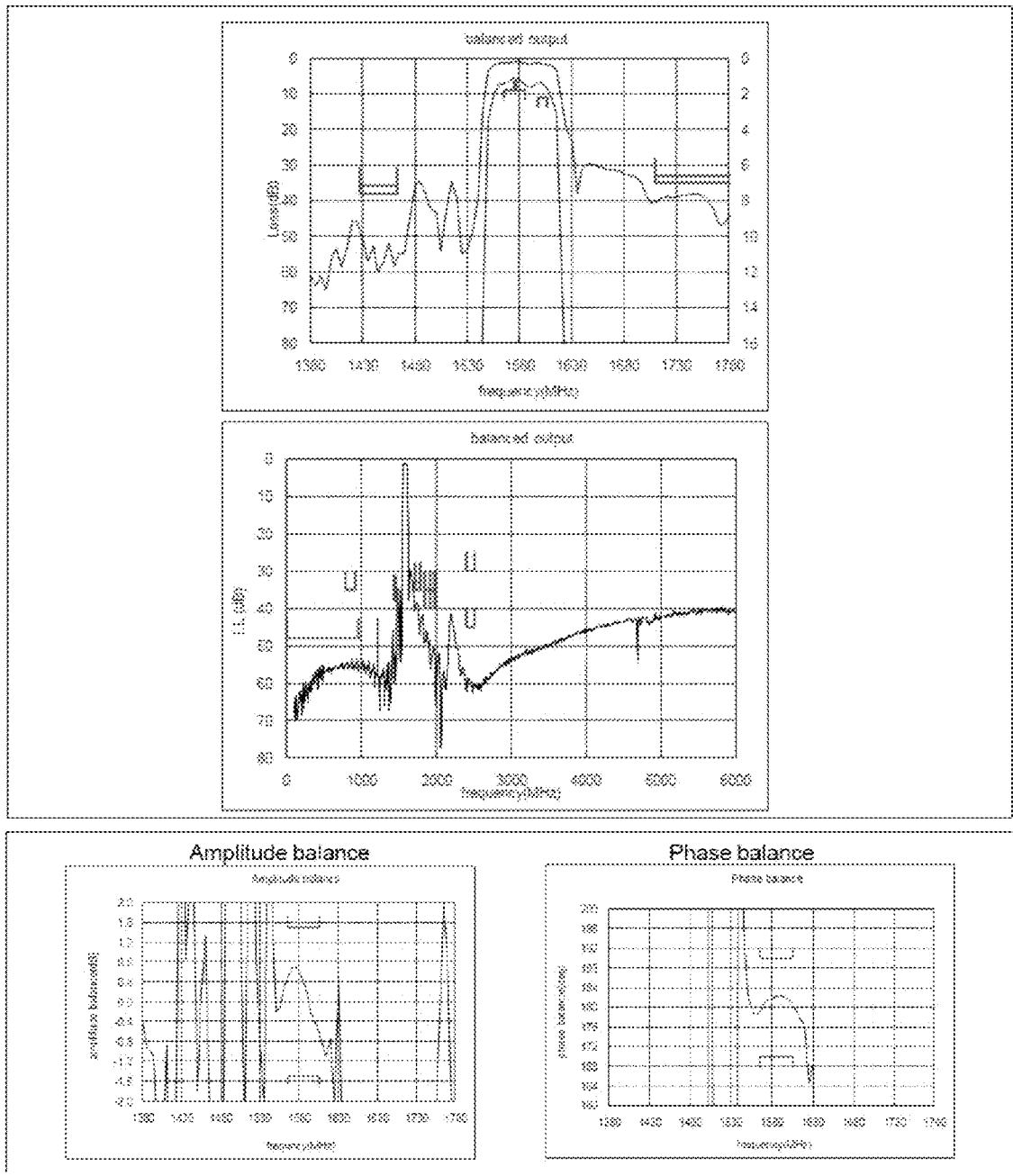
FIG. 4 depicts several response curves for a SAW filter that may be used to implement some embodiments of the present disclosure.

The second LNA stage of signal path 202 includes another filter and another LNA, specifically filter 214 and LNA 216. Filter 214 may reject more of the signals from outside of the L1 band than filter 210 does alone. In one example, filter 214 is a SAW filter. FIG. 3 depicts a table containing several parameters for a SAW filter that could be used to implement filter 214. For example, filter 214 may have a 3 db bandwidth of less than 60 MHz, a center frequency of 1574-1577 MHz, and an insertion loss of less than 2 db. FIG. 4 depicts several response curves for the same SAW filter. Implementing filter 214 with a SAW filter may have the added benefit of using a minimal amount of space.

While the addition of filter 214 may help reduce interference from other portions of the frequency spectrum, it may also degrade the GNSS signals due to the insertion loss of the filter. LNA 216 may counteract the insertion loss of filter 214 by amplifying the GNSS signals. LNA 216 may be implemented using the same or a different LNA as LNA 214.

The third LNA stage of signal path 202 includes another filter and another LNA, specifically filter 218 and LNA 220, which serve a similar purpose as filter 214 and LNA 216 of the second LNA stage. Filter 218 may be implemented using the same or a different filter as filter 214. Similarly, LNA 220 may be implemented using the same or a different LNA as LNA 216.

Figure 5:
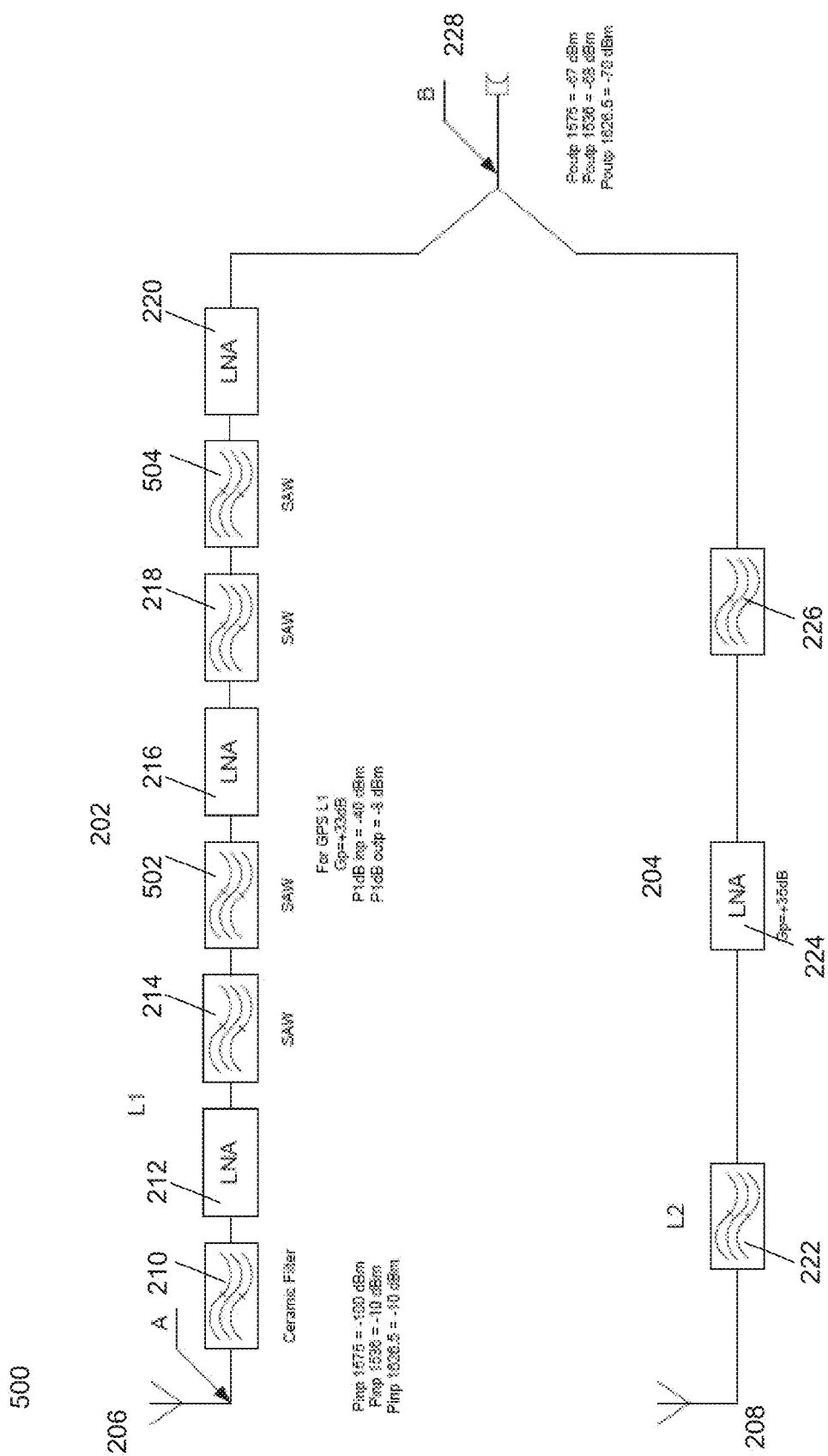
FIG. 5 depicts a third antenna LNA filter for use with a GNSS device according to another embodiment of the present disclosure.

FIG. 5 depicts an embodiment of third antenna LNA filter 500 according to another embodiment of the present disclosure. Antenna LNA filter 500 is similar to antenna LNA filter 200 except the second and third LNA stages each have an additional filter, filter 502 and filter 504, respectively. Filters 502 and 504 may be implemented using the same or a different filter as filter 214.

The added filters of LNA filter 500 may further reduce the negative impact of signals from outside of the L1 band. However, the added filters may also increase the ripple group delay across the L1 band, thereby reducing timing accuracy. For GNSS signals that are transmitted on different channels within the L1 band, the inter-channel bias that is partially dependent on the group delay across the L1 Band, can be accounted for. This is discussed in U.S. Pat. No. 8,022,868, which is herein incorporated by reference for all purposes.

While FIGS. 1, 2, and 5 depict the components of the respective antenna LNA filter as being directly connected to each other, it should be understood that the claims are not limited in this manner. Rather, those skilled in the art will understand that additional components, such as matching networks and bias circuits are required for the antenna LNA filters depicted in FIGS. 1, 2, and 5.

Similarly, the depiction of the various components of the above described antenna LNA filters should not be construed to mean that each component must be in a separate package. For example, multiple filters could be packaged together. As another example, one or more filters could be packaged with one or more LNAs.

Figure 6:
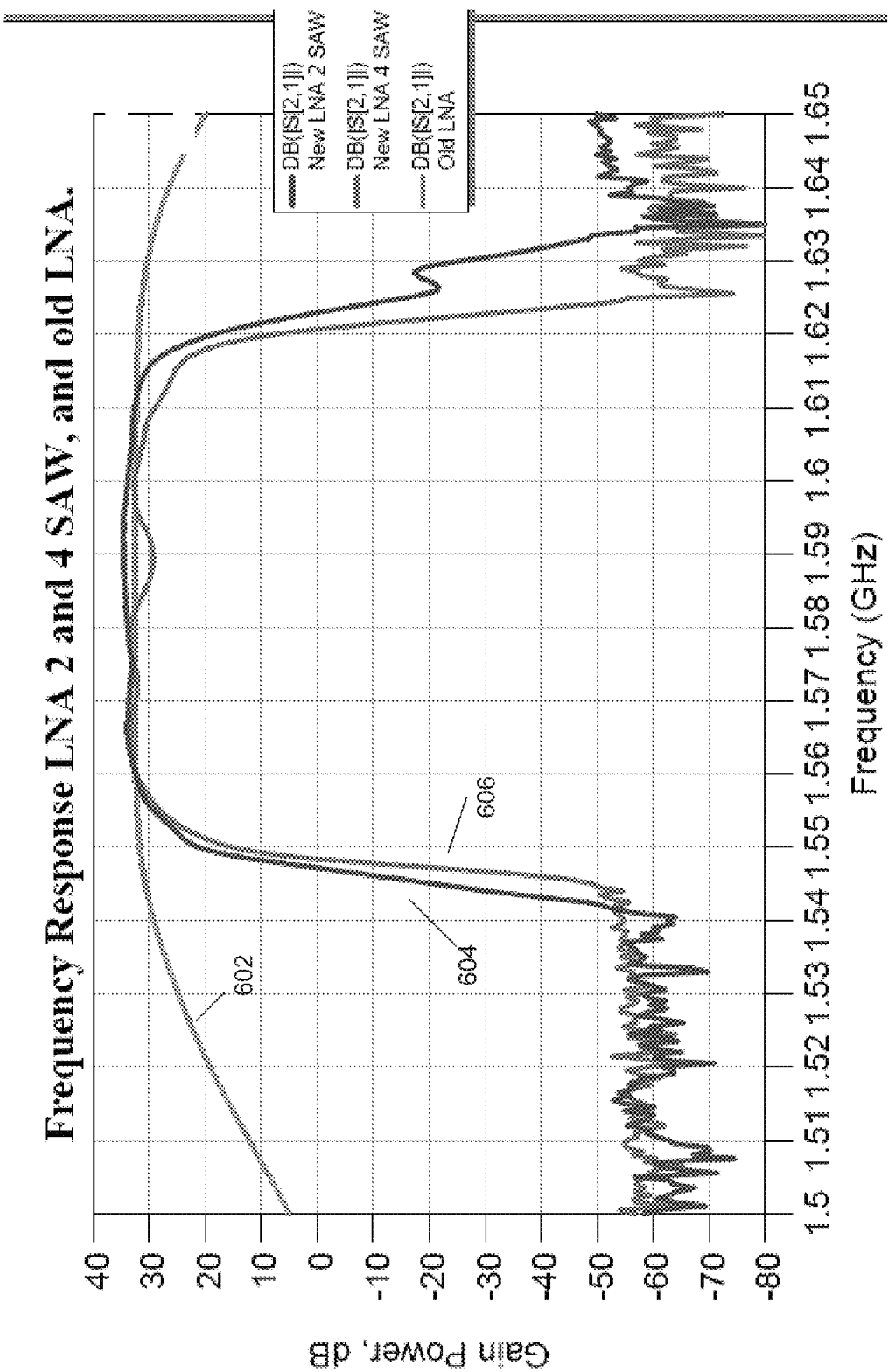
FIG. 6 is a graph showing the group delay of the first, second, and third antenna LNA filters.

FIG. 6 is a graph of the frequency response for the above described antenna LNA filters. The frequency response of antenna LNA filter 100 (FIG. 1) is represented by curve 602. The frequency response of antenna LNA filter 200 (FIG. 2) is represented by curve 604. The frequency response of antenna LNA filter 500 (FIG. 5) is represented by curve 606. As can be seen, the addition of the filters in the second and third cascaded stages of the antenna LNA filters 200 and 500 greatly reduce out of band interference while maintaining the same level of gain for the in-band GNSS signals. For example, a gain of LNA filter 200 below frequencies of 1540 MHz and above 1640 MHz is less than −40 dB. Additionally, the addition of four filters and two LNAs in antenna LNA filter 500 has improved the out of band interference for the frequency just above the L1 band as compared to antenna LNA filter 200. For example, a gain of LNA filter 500 below frequencies of 1540 MHz and above 1625 MHz is less than −40 dB. Processors operating at these frequency ranges may generate interference in this portion of the spectrum. Accordingly, if a GNSS device is using a processors or other electrical components (e.g., communication modules such as a Light-Squared module) that operate in this frequency range, then antenna LNA filter 500 may provide some benefits over antenna LNA filter 200 by better attenuating noise from this portion of the spectrum.

Figure 7:
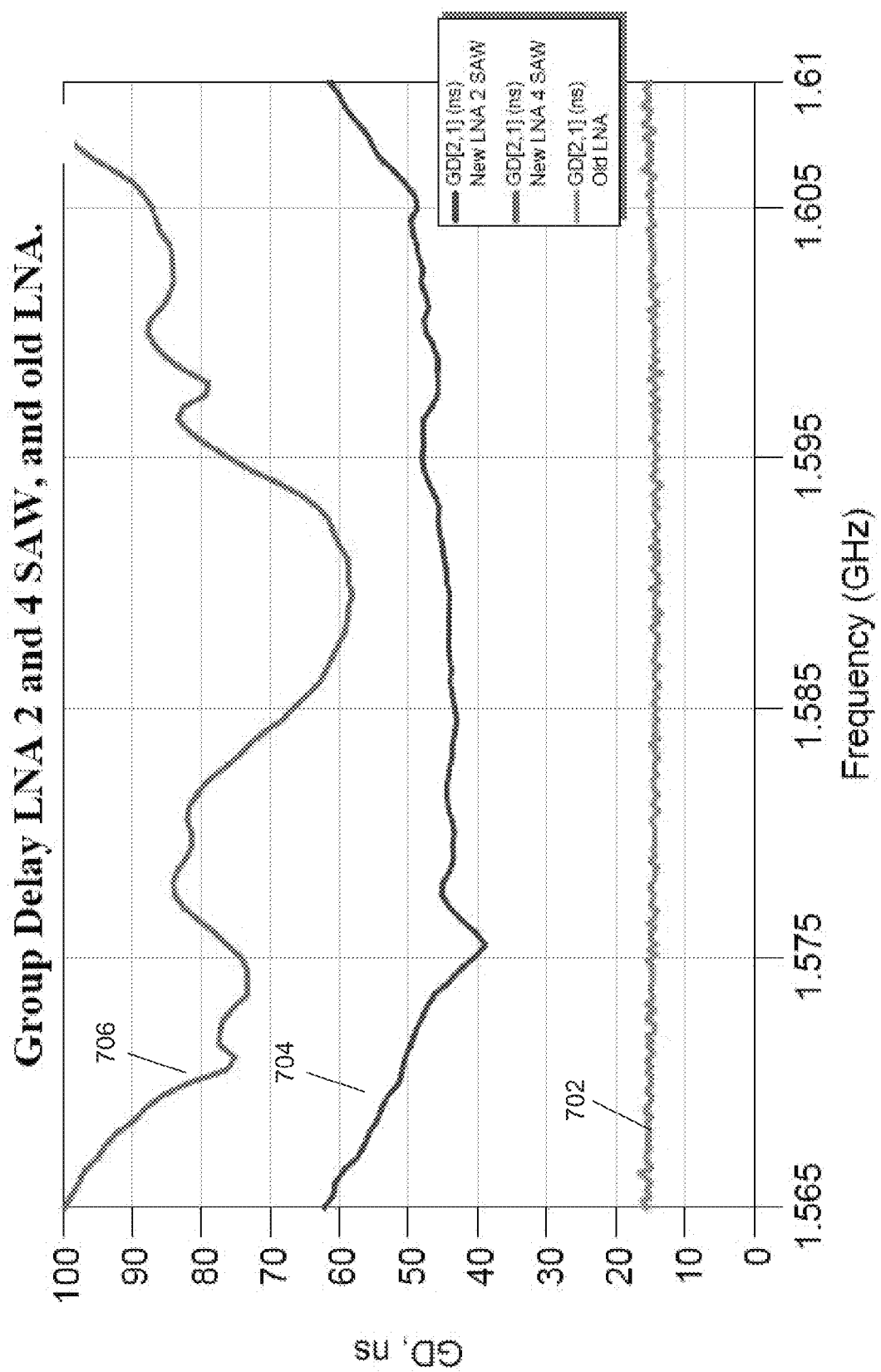
FIG. 7 is a graph showing the frequency response of the first, second, and third antenna LNA filters.

FIG. 7 is a graph showing the group delay for the above described antenna LNA filters. The group delay of antenna LNA filter 100 (FIG. 1) is represented by curve 702. The group delay of antenna LNA filter 200 (FIG. 2) is represented by curve 704. The group delay of antenna LNA filter 500 (FIG. 5) is represented by curve 706. Ripple group delay for antenna LNA filter 500 is less than 40 ns (e.g., about 33 ns) in the GPS band and less than 60 ns (e.g., 43 ns) in the GLONASS band. Ripple group delay for antenna LNA filter 200 is about 23.4 ns in the GPS band and 16.8 ns in the GLONASS band. Ripple group delay for antenna LNA filter 100 is about 2 ns in the GPS band and 2 ns in the GLONASS band. All of these ripple group delays are within the limit of 40 ns for the GPS band and 60 ns for the GLONASS band.

Figure 8:
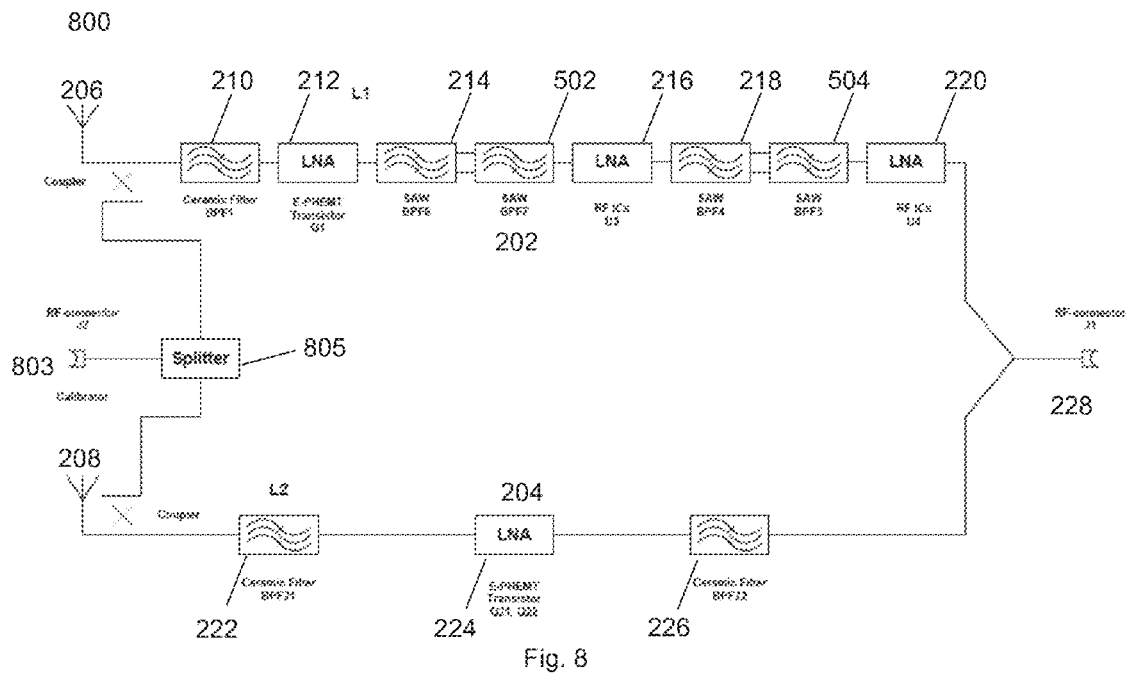
FIG. 8 depicts another antenna LNA filter according to an embodiment of the present disclosure.

FIG. 8 depicts an embodiment of fourth antenna LNA filter 800 according to another embodiment of the present disclosure. Antenna LNA filter 800 is similar to antenna LNA filter 500 except that filter 800 further includes splitter 805 coupled to receive a calibration signal from coupling 803. Splitter 805 may be configured to selectively couple the calibration signal to either path 202 or path 204.

Figure 9:
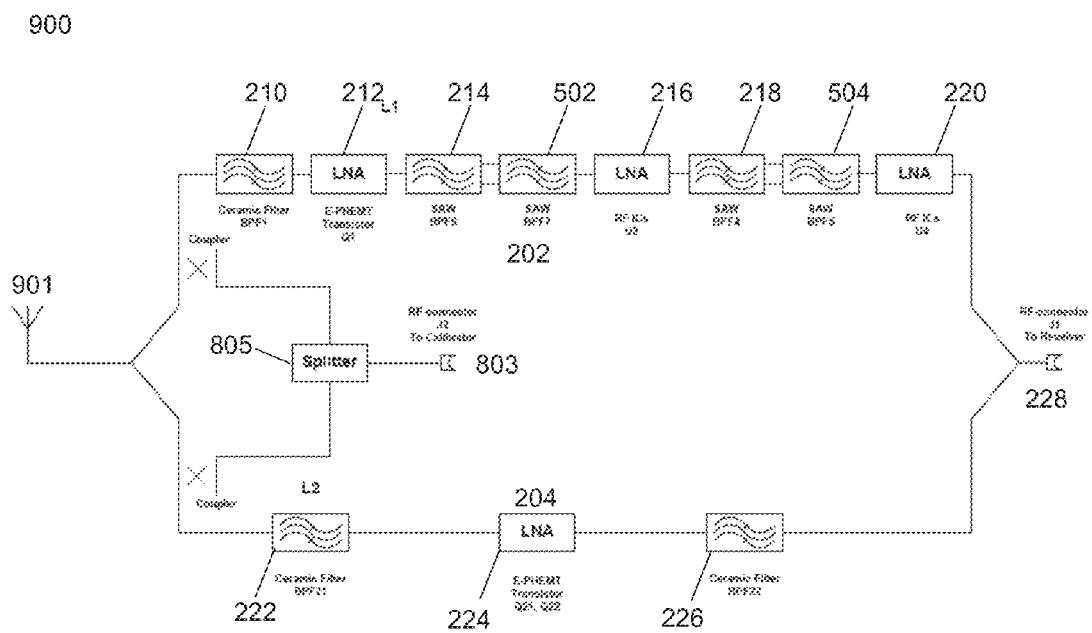
FIG. 9 depicts yet another antenna LNA filter accordingly to an embodiment of the present disclosure

FIG. 9 depicts an embodiment of fourth antenna LNA filter 900 according to another embodiment of the present disclosure. Antenna LNA filter 900 is similar to antenna LNA filter 800 except that antennas 206 and 208 are replaced with a single antenna 901 operable to receive GNSS signals on both the L1 and L2 bands.

What is claimed is:

1. A low-noise amplifier (LNA) filter comprising:
a first LNA stage having a first input and a first output, wherein the first input is configured to electrically connect to an antenna configured to receive global navigation satellite system (GNSS) signals, and wherein the first LNA stage includes a first LNA and a ceramic filter;
a second LNA stage having a second input and a second output, wherein the second input is electrically connected to the first output, and wherein the second LNA stage includes a second LNA and a first surface acoustic wave (SAW) filter; and
a third LNA stage having a third input and third output, wherein the third input is connected to the second output, and wherein the third LNA stage includes a third LNA and a second SAW filter.

2. The LNA filter of claim 1, wherein the second LNA stage includes a third SAW filter and wherein the third LNA stage includes a fourth SAW filter.

3. The LNA filter of claim 2, wherein an output of the first SAW filter is connected to an input of the third SAW filter, and wherein an input of the second LNA is connected to an output of the third SAW filter.

4. The LNA filter of claim 2, wherein the first LNA and the second LNA are implemented with the same circuit topologies.

5. The LNA filter of claim 2, wherein at least one of the first, second, third, or fourth SAW filters have a 3 db bandwidth of less than 60 MHz, a center frequency of 1574-1577 MHz, and an insertion loss of less than 2 db.

6. The LNA filter of claim 2, wherein the first, second, third, and fourth SAW filters have a 3 db bandwidth of less than 60 MHz, a center frequency of 1574-1577 MHz, and an insertion loss of less than 2 db.

7. The LNA filter of claim 2, wherein the first LNA is implemented with a high-electron mobility transistor.

8. The LNA filter of claim 2, wherein a ripple group delay in a GPS band is less than 40 ns.

9. The LNA filter of claim 2, wherein a ripple group delay in a GLONASS band is less than 60 ns.

10. The LNA filter of claim 1, wherein a gain of the LNA filter below frequencies of 1540 MHz and above frequencies of 1640 MHz is less than −40 dB.

11. The LNA filter of claim 1, wherein a gain of the LNA filter below frequencies of 1540 MHz and above frequencies of 1625 MHz is less than −40 dB.

12. A global navigation satellite system (GNSS) device comprising:
a radio frequency (RF) front-end comprising:
a first signal path having a first LNA stage comprising a first LNA and a ceramic filter, a second LNA stage comprising a second LNA and a first SAW filter, and a third LNA stage comprising a third LNA and a second SAW filter; and
a second signal path having a fourth LNA and a plurality of filters;
a first antenna coupled to the first signal path and configured to receive GNSS signals; and
a second antenna coupled to the second signal path and configured to receive GNSS signals.

13. The GNSS device of claim 12, wherein the first and second antennas are different antennas.

14. The GNSS device of claim 12, wherein the first and second antennas are the same antenna.

15. The GNSS device of claim 12, wherein the second LNA stage further includes a third SAW filter and the third LNA stage further includes a fourth SAW filter.

16. The GNSS device of claim 12, wherein at least one of the first or second SAW filters have a 3 db bandwidth of less than 60 MHz, a center frequency of 1574-1577 MHz, and an insertion loss of less than 2 db.

17. The GNSS device of claim 12, wherein the first and second SAW filters have a 3 db bandwidth of less than 60 MHz, a center frequency of 1574-1577 MHz, and an insertion loss of less than 2 db.

18. The GNSS device of claim 12, wherein a ripple group delay for the RF front end in the GPS band is less than 40 ns.

19. The GNSS device of claim 12, wherein a ripple group delay for the RF front end in the GLONASS band is less than 60 ns.

20. The GNSS device of claim 12, wherein a gain for the RF front end below frequencies of 1540 MHz and above frequencies of 1640 MHz is less than −40 dB.

21. The GNSS device of claim 12, wherein a gain for the RF front end below frequencies of 1540 MHz and above frequencies of 1625 MHz have is less than −40 dB.

* * * * *